United States Patent [19]
Mathieu et al.

[11] Patent Number: 5,192,915
[45] Date of Patent: Mar. 9, 1993

[54] EDGE INTEGRATING PHASE DETECTOR

[75] Inventors: Alan E. Mathieu; Edward D. Wardzala, both of Portland; Michael S. Overton, Aloha, all of Oreg.

[73] Assignee: Tektronix, Inc., Wilsonville, Oreg.

[21] Appl. No.: 920,180

[22] Filed: Jul. 27, 1992

Related U.S. Application Data

[63] Continuation of Ser. No. 717,440, Jun. 19, 1991, abandoned.

[51] Int. Cl.[5] .......................... H03K 9/06; H03K 5/13
[52] U.S. Cl. ..................... 328/133; 328/155; 307/262; 307/511; 331/25
[58] Field of Search ............... 328/155, 133, 127, 114, 328/132, 151; 307/262, 517; 331/1 A, 25, 17; 358/319, 320

[56] References Cited

U.S. PATENT DOCUMENTS

| | | | |
|---|---|---|---|
| 3,311,751 | 3/1967 | Maestre | 328/155 |
| 3,471,719 | 10/1969 | Hughes | 307/255 |
| 3,614,635 | 10/1971 | LaPine et al. | 331/17 |
| 3,624,521 | 6/1970 | Dellicicchi | 328/155 |
| 3,651,416 | 3/1972 | Hobrough | 328/155 |
| 3,694,776 | 9/1972 | Linder | 307/543 |
| 4,007,429 | 2/1977 | Cadalora et al. | 331/17 |
| 4,034,309 | 7/1977 | Vaughn | 328/155 |
| 4,721,924 | 1/1988 | Masdea et al. | 331/17 |
| 4,751,468 | 6/1988 | Agoston | 328/155 |
| 4,933,578 | 6/1990 | Nishimura | 307/310 |

Primary Examiner—Timothy P. Callahan
Attorney, Agent, or Firm—Francis I. Gray

[57] ABSTRACT

An edge integrating phase detector for a phase locked loop passes a portion of a sync edge of an input video signal as a sampled signal to an integrator in response to a gate pulse nominally centered on a timing reference point of the sync edge. The sampled signal has a positive and negative portion. The integrator produces from the sampled signal a control signal for a VCO that is proportional to the unbalance between the positive and negative portions. The gate pulse is generated from the output of the VCO as a function of the nominal period of the input video signal.

3 Claims, 2 Drawing Sheets

EDGE INTEGRATING PHASE DETECTOR

This is a continuation of application Ser. No. 07/717,440 filed Jun. 19, 1991 and now abandoned.

BACKGROUND OF THE INVENTION

The present invention relates to phase locked loops, and more particularly to an edge integrating phase detector for a phase lock loop that acts to minimize jitter due to noise of a timing system derived from an input signal while maintaining a relatively large bandwidth in the system to respond to timing variations in the input signal.

In a raster scanned video system a video waveform has a repetitive reference component, referred to as sync, that is used to generate timing for the system. To generate this timing it is necessary to lock a local oscillator to the sync component so that all processing within the system occurs at known timing relationships with the video waveform. Commonly a phase locked loop is used that compares the phase of a reference clock to a sync signal derived from the sync component and adjusts the frequency of the reference clock until the phase between the two signals has a predetermined value. Typically the video waveform is input to a sync stripper that provides the derived sync signal as a train of pulses, each pulse having a leading edge corresponding to a timing reference point on the video waveform. The sync stripper compares the video waveform with a fixed level, with the leading edges of the pulses in the derived sync signal occurring when the video waveform level crosses the fixed level in a given direction. Noise in the video waveform causes this crossing point to vary on a random basis, producing jitter in the derived sync signal.

The derived sync signal is input to a phase detector together with a clock signal derived from the video system clock. The difference in phase between the appropriate clock signal edge and the corresponding sync signal edge is converted into an error voltage that is applied to the system clock to adjust its frequency until the phase difference achieves the predetermined value. If there is noise on the video waveform that causes jitter in the derived sync signal, as described above the period between the pulses of the derived sync signal vary, and there is a constant correcting of the system clock such that the phase locked loop output has jitter relative to the input signal. To reduce this jitter effect due to noise, a loop filter having a very low bandwidth is inserted into the phase locked loop so that only an average variation in the period between pulses affects the timing of the phase locked loop. The low bandwidth loop filter, while effectively reducing jitter, reduces the response time to variations in the reference sync signal.

What is desired is a phase locked loop that reduces jitter due to noise on a video waveform while maintaining the ability to respond rapidly to variations in the video waveform.

SUMMARY OF THE INVENTION

Accordingly the present invention provides an edge integrating phase detector for a phase lock loop that reduces jitter due to noise on an input video waveform by integrating an edge of a sync pulse contained within the video waveform. The input video waveform is buffered and input to a gated sampling circuit that passes the edge, or transition, of the sync pulse to an integrating circuit. A gate signal for the gated sampling circuit is derived from a system clock. The output of the integrating circuit is input to an error amplifier together with a reference signal that represents the timing reference level of the sync pulse to produce an error signal that is fed back to control the frequency of the system clock, and thus the position of the gate signal relative to the sync pulse edge.

The objects, advantages and other novel features of the present invention are apparent from the following detailed description when read in conjunction with the appended claims and attached drawing.

DESCRIPTION OF THE PREFERRED EMBODIMENT

Figure 1:
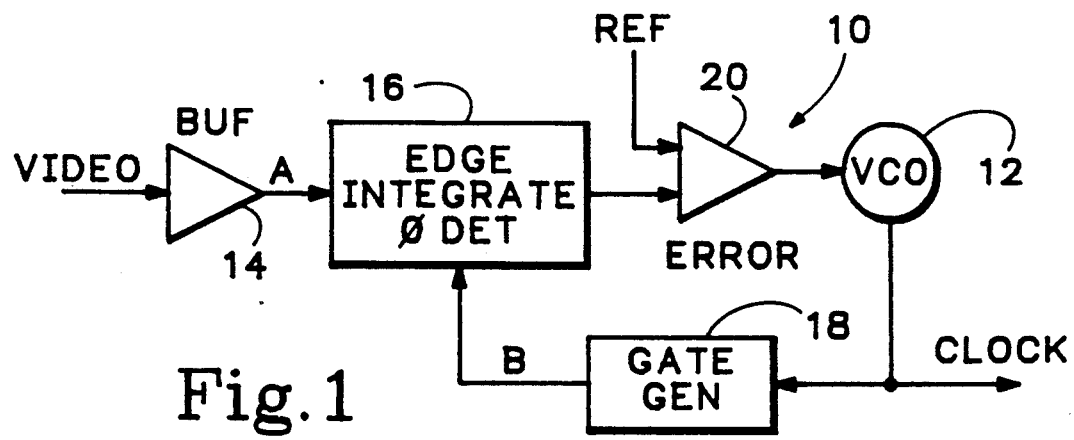
FIG. 1 is a block diagram of a phase locked loop incorporating an edge integrating phase detector according to the present invention.

Referring now to FIG. 1 a phase locked loop 10 is shown having a voltage controlled oscillator (VCO) 12 that provides a system clock signal CLOCK. An input signal A having a repetitive component, such as a video signal having a sync component, is input to a buffer amplifier 14, the output of which is coupled as an input to an edge integrating phase detector 16. Also coupled as an input to the edge integrating phase detector 16 is a gate strobe signal B. The gate strobe signal B is produced by a gate generator 18 that receives as an input the clock signal. The input signal is integrated by the edge integrating phase detector 16 during the gate strobe signal B. The integrated result from the edge integrating phase detector 16 is input as an essentially d.c. signal to an error amplifier 20 that includes a loop filter. The d.c. signal is compared in the error amplifier 20 with a reference voltage REF that corresponds to the appropriate voltage level for the timing reference point of the input signal. For an HDTV video signal the voltage level for the sync point is ground, while for an NTSC video signal the voltage level for the sync point is −20 IRE. The output of the error amplifier 20 is an error signal that is applied to the VCO 12 to adjust the frequency of the VCO. The integration of the sync edge essentially removes jitter due to noise so that the loop filter of the error amplifier 20 may have a higher bandwidth, i.e., on the order of 50 times higher, than prior art loop filters.

Figure 2:
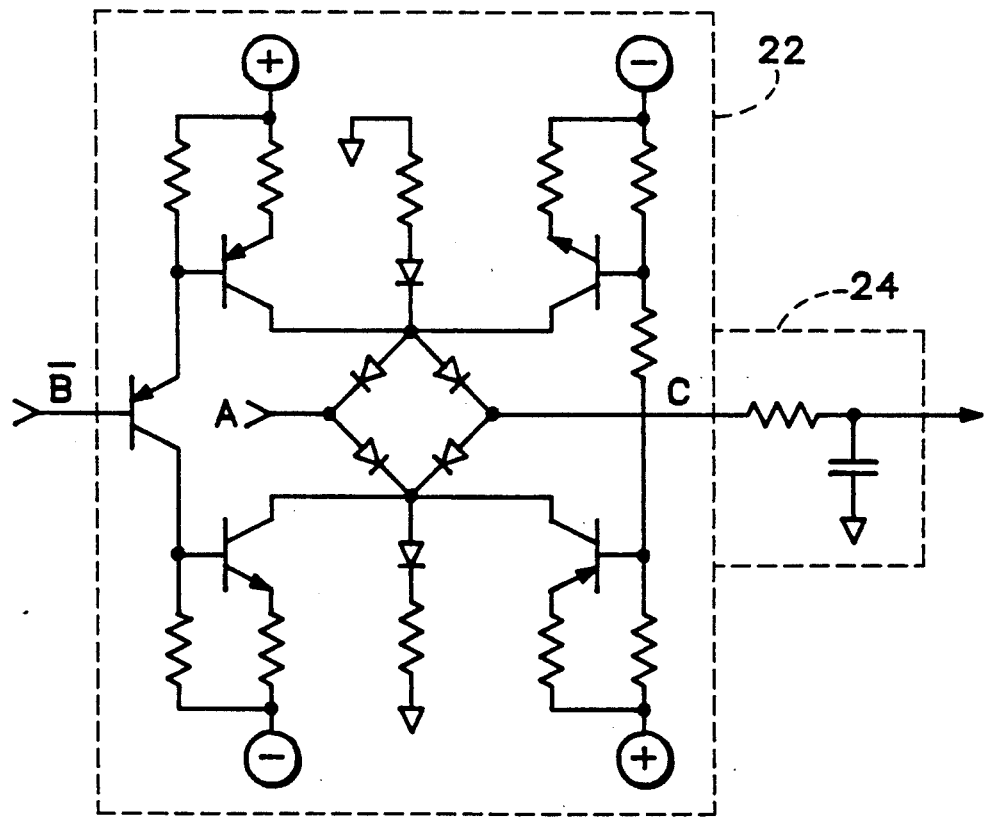
FIG. 2 is a simplified schematic diagram of the edge integrating phase detector according to the present invention.

As shown in FIG. 2 the gate strobe signal B, or its inverse B, is input to a sampling circuit 22. Also input to the sampling circuit 22 is the input signal A. At the output C of the sampling circuit 22 the portion of the input signal A captured during the gate strobe signal B is passed to an integrating circuit 24. Any suitable integrating circuit may be used, and in its most simplistic form is an RC circuit as shown. The integrating circuit 24 integrates about the sync point so that there is a negative and positive portion at the input. For lock the negative and positive portions are equal, i.e., the gate strobe signal B is centered about the sync point, and the output of the integrating circuit 24 is at the reference level so that the output of the error amplifier 20 does not change the VCO 12 frequency.

Figure 3:
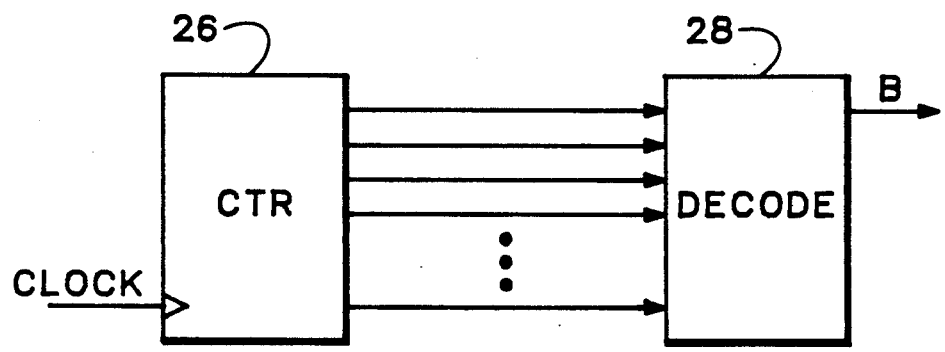
FIG. 3 is a simplified block diagram of a gate generator for the edge integrating phase detector according to the present invention.

The gate strobe signal generator 18 is shown in FIG. 3 as having a counter 26 and a decoder 28. The counter 26 counts the pulses of the clock signal CLOCK from the VCO 12. The count from the counter 16 is input to the decoder 28 that provides the leading edge of the gate strobe signal B when the count reaches a predetermined value that is a function of the format of the input signal. If the phase locked loop 10 is locked, then the leading edge of the gate strobe signal B occurs shortly after the start of the transition of the sync edge from one level to another. The decoder 28 holds the gate strobe signal B for a range of counts from the counter 26 corresponding to a predetermined number of pulses of the clock signal CLOCK.

Figure 4:
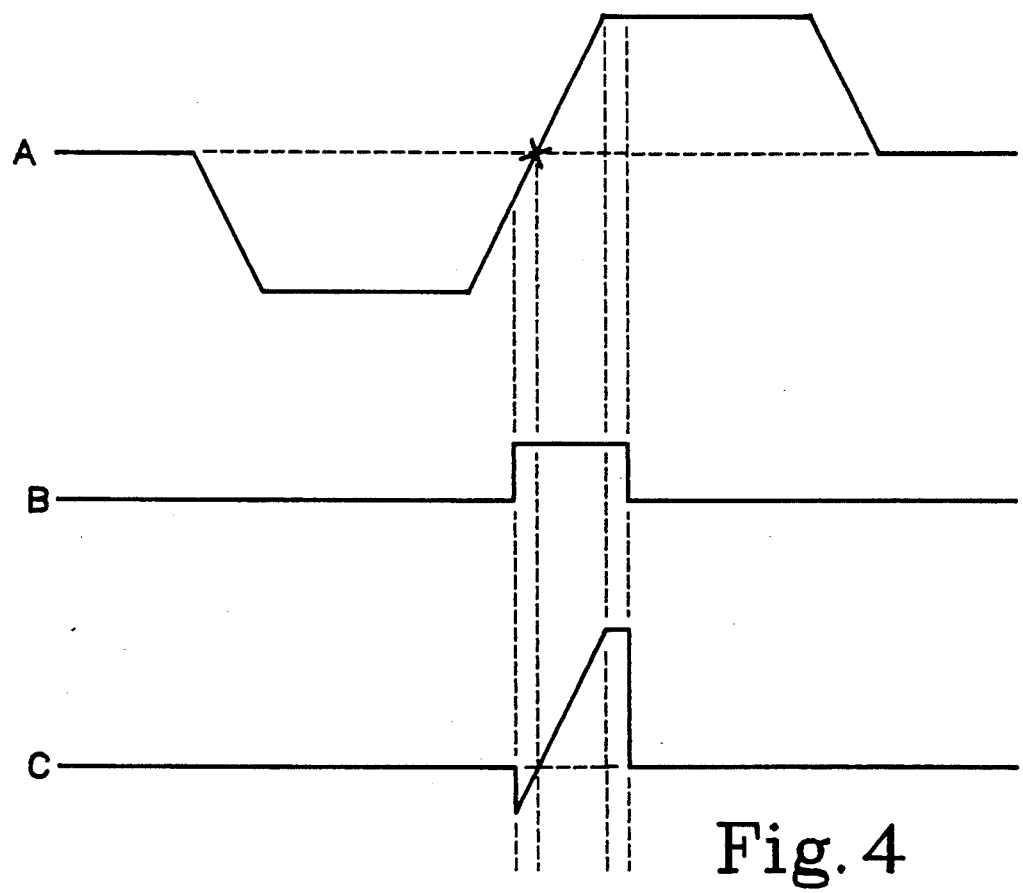
FIG. 4 is a timing diagram for the phase locked loop incorporating the edge integrating phase detector according to the present invention.

In operation as shown in FIG. 4 an HDTV video signal A has a tri-level sync pattern with the sync point X occurring at the middle of the rising transition. The gate strobe signal B turns on the sampling circuit 22 and allows a portion C of the sync signal to drive the integrating circuit 24. As shown in this example the gate strobe signal B is late so that the integrating circuit 24 receives unequal positive and negative inputs. The output of the integrating circuit 24 is proportional to the input unbalance, and thus through the error amplifier 20 drives the VCO 12 to correct the gate strobe signal timing. Noise that occurs within the gate strobe period is integrated and has little effect on the timing of the phase locked loop 10.

For a particular HDTV television application the VCO 12 may have a range of frequencies between 68–78 MHz. The rise time of the sync edge of the HDTV video signal is approximately 50 ns, while the fall time of the sync edge of an NTSC video signal is approximately 140 ns. The strobe width of the gate strobe signal B preferably is less than the transition times of the sync edges, i.e., strobe widths of 40 ns for HDTV and 110 ns for NTSC, but it may be longer so long as the width is substantially filled by the transition so that the error signal is essentially the integral of the sync edge transition. Also a variable delay circuit, such as that described in *Research Disclosure* August 1990, pages 633–634, may be inserted in the gate strobe signal path to provide more precise timing for varying the phase of the system clock CLOCK relative to the input signal.

Thus the present invention provides an edge integrating phase detector for a phase locked loop that integrates the transition of a repetitive component in an input signal in order to generate an error signal for controlling the phase of a clock oscillator relative to the repetitive component while minimizing the effect of noise on the phase locked loop.

What is claimed is:

1. A phase locked loop of the type having an oscillator for generating a system clock, the frequency of the oscillator being determined by a control signal derived from the system clock and a repetitive component of an input signal, comprising:
   means responsive to the system clock for generating a gate signal having a duration equal to a portion of a transition of the repetitive component; and
   means for integrating the transition in response to the gate signal to produce the control signal.

2. A phase locked loop as recited in claim 1 wherein the integrating means comprises:
   means for sampling the input signal during the gate signal to produce a sample signal having positive and negative portions; and
   means for generating the control signal as a function of an unbalance between the positive and negative portions.

3. A phase locked loop as recited in claim 2 wherein the gate signal generating means comprises:
   means for counting pulses of the system clock to produce a count output; and
   means for decoding the count output to produce the gate signal so that the gate signal occurs nominally during the transition when the phase locked loop is locked.

* * * * *